(12) United States Patent
Eto et al.

(10) Patent No.: US 6,169,701 B1
(45) Date of Patent: *Jan. 2, 2001

(54) SEMICONDUCTOR MEMORY DEVICE USING SHARED SENSE AMPLIFIER SYSTEM

(75) Inventors: Satoshi Eto; Masato Matsumiya; Hideki Kanou, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/946,586

(22) Filed: Oct. 7, 1997

(30) Foreign Application Priority Data

Apr. 25, 1997 (JP) .................................................. 9-109423

(51) Int. Cl.[7] ........................................................ G11C 8/00
(52) U.S. Cl. ................ 365/230.06; 365/149; 365/230.03
(58) Field of Search .................................. 365/203, 205, 365/144, 230.03, 230.06

(56) References Cited

U.S. PATENT DOCUMENTS 5,243,574 * 9/1993 Ikeda ..................................... 365/207
5,740,113 * 4/1998 Kaneko ............................. 365/189.11

* cited by examiner

Primary Examiner—David Nelms
Assistant Examiner—Hoai V. Ho
(74) Attorney, Agent, or Firm—Arent Fox Kintner Plotkin & Kahn PLLC (57) ABSTRACT

In the present invention, the gate electrodes of the bit line transfer gates for bit line pair selection that perform connection and isolation of the sense amplifiers and bit line pairs are put into floating condition during activation of the sense amplifier in the active period. Thus, a system is adopted according to which the potential of the bit line is driven to power source voltage Vcc or high voltage corresponding thereto by the sense amplifier in the active condition, the pre-charging potential of the bit line pair being made lower than half the power source voltage Vcc, for example ground potential Vss. Thanks to the amplification action of the sense amplifier, by utilising the fact that one side of the plurality of bit line pairs is inevitably driven from low potential to the power source voltage Vcc level or high voltage corresponding thereto, the potential of the gate electrodes which are in floating condition is boosted higher due to capacitive coupling, enabling the potential of the bit line on rewriting to be boosted to a voltage driven by the sense amplifier, for example power source voltage.

8 Claims, 9 Drawing Sheets

SEMICONDUCTOR MEMORY DEVICE USING SHARED SENSE AMPLIFIER SYSTEM

BACKGROUND OF THE INVENTION

1. Field of the Invention

The present invention relates to a semiconductor memory device and relates to a novel drive of a bit line transfer gate for bit line pair selection in a shared sense amplifier system in which bit line pairs on both sides use a common sense amplifier.

2. Description of the Related Art

In dynamic random access memories (DRAMs) larger capacity, lower power source voltage and lower power consumption are being demanded. The power source voltage Vcc is lowered from the conventional 5V to 3V and the power source voltage Vcc within the chip is boosted to generate a boosted power source voltage Vpp of for example 5V.

Also, in order to respond to the demands for increasing capacity, a shared sense amplifier system is employed in which a sense amplifier array is arranged between two memory cell arrays and the sense amplifiers are shared by respective bit line pairs of respective memory cell arrays. With such a shared sense amplifier system, thanks to sharing of the sense amplifier array, their number can be reduced. However, for this purpose it is necessary to provide bit line transfer gates for selection of either side of bit line pairs between the bit line pairs and sense amplifiers in order to effect connection and isolation of these, the bit line pairs of the selected memory cell array being connected to the sense amplifiers while the bit line pairs of the non-selected memory cell array are isolated from the sense amplifiers.

To achieve this, there is provided a bit line transfer gate drive circuit that, during the pre-charging period, allows the bit line transfer gates on both sides to conduct and, during the active period, makes the bit-line transfer gates on the non-selected side non-conductive, while conduction of the bit-line transfer gates on the selected side is maintained. Specifically, this bit line transfer gate drive circuit, during pre-charging, makes the potential of the gate electrodes of the bit line transfer gates H level, higher than the internal power source, and, in the active period, lowers the potential of the gate electrodes on the non-selected side to L level, while maintaining that of those on the selected side at H level.

In a DRAM, the potential of a bit line connected to a memory cell is changed depending on the charge storage condition of the capacitor for charge storage provided in the memory cell, and this minute change of potential is detected by a sense amplifier. Thus, since a DRAM is a destructive read device, once this potential difference of the bit line pair has been detected by the sense amplifier and amplified, this potential must again be rewritten to the memory cell capacity through the bit line.

With increase in capacity of DRAMs in recent years, memory cell capacities have become very small, so during rewriting it is necessary to drive the potential of the H-level bit line to quite a high level. For this purpose, when rewriting during the active period, it is necessary to pull up the potential of the gate electrode of the bit line transfer gates referred to above to a higher potential than the high potential applied to the bit line. For example, if the H-level bit line potential is the power source voltage Vcc level, it is necessary to pull the gate potential of the bit line transfer gate up to a boosted power source Vpp level higher than power source voltage Vcc.

However, generation of boosted power source Vpp within the chip is a factor that increases power consumption. In particular, in a drive circuit for bit line transfer gates, the ability to drive the gate electrodes of the bit line transfer gates respectively provided between a large number of bit line pairs and sense amplifiers is demanded; thus the load capacity to be driven is large and very large power consumption is needed to drive the gates up to the boosted power source level mentioned above.

Such increased power consumption raises the chip temperature and is a considerable obstacle to increasing capacity and raising speed of operation.

An object of the present invention is therefore to provide a semiconductor memory device wherein the above problems are eliminated and the power consumption of the bit line transfer gate drive circuit is reduced.

A further object of the present invention is to provide a semiconductor memory device having a bit line transfer gate drive circuit that is operated by power source voltage without needing to use a boosted power source.

SUMMARY OF THE INVENTION

In order to achieve the above objects, in the present invention, the gate electrodes of the bit line transfer gates for bit line pair selection that perform connection and isolation of the sense amplifiers and bit line pairs are put into floating condition during activation of the sense amplifier in the active period. Thus, a system is adopted according to which the potential of the bit line is driven to power source voltage Vcc or a high voltage corresponding thereto by the sense amplifier in the active condition, the pre-charging potential of the bit line pair being made lower than half the power source voltage Vcc, for example ground potential Vss.

Thanks to the amplification action of the sense amplifier, by utilising the fact that one side of the plurality of bit line pairs is inevitably driven from low potential to the power source voltage Vcc level or high voltage corresponding thereto, the potential of the gate electrodes which are in floating condition is boosted higher due to capacitative coupling, enabling the potential of the bit line on rewriting to be boosted to a voltage driven by the sense amplifier, for example power source voltage.

Specifically, according to this invention there are provided: semiconductor memory device comprising: first and second memory cell arrays comprising a plurality of word lines, a plurality of bit line pairs intersecting thereto, and memory cells provided at intersections therebetween; a pre-charging circuit that drives the bit lines pairs together to a first potential in a pre-charging period; a row of sense amplifiers, arranged between the first and second memory cell arrays, in an active period, detecting the potential differences of these bit lines pairs and driving one of these bit lines to a second potential higher than the first potential; first bit line transfer gates for selection of the bit line pairs, respectively arranged between the bit line pairs of the first memory cell array and the sense amplifiers, conducting when the first memory cell array is selected; second bit line transfer gates for selection of the bit line pairs, respectively arranged between the bit line pairs of the second memory cell array and the sense amplifiers, conducting when the second memory cell array is selected; and a bit line transfer gate drive circuit which puts the gate electrodes of the first or second bit line transfer gates into floating condition when, in the active period, the corresponding memory cell array is selected.

With such a construction, the bit line transfer gate drive circuit can make the gate electrodes be self-boosted by the drive operation of the sense amplifier simply by putting them in floating condition from the power source voltage Vcc or high level corresponding thereto, without needing to drive the gate electrodes of the bit line transfer gates to a boosted power source Vpp higher than the H level of the bit line. Power consumption can therefore be greatly reduced.

DESCRIPTION OF THE PREFERRED EMBODIMENTS

Preferred embodiments of the present invention are described below with reference to the drawings. However, these embodiments are not limitative of the technical scope of the present invention.

Figure 1:
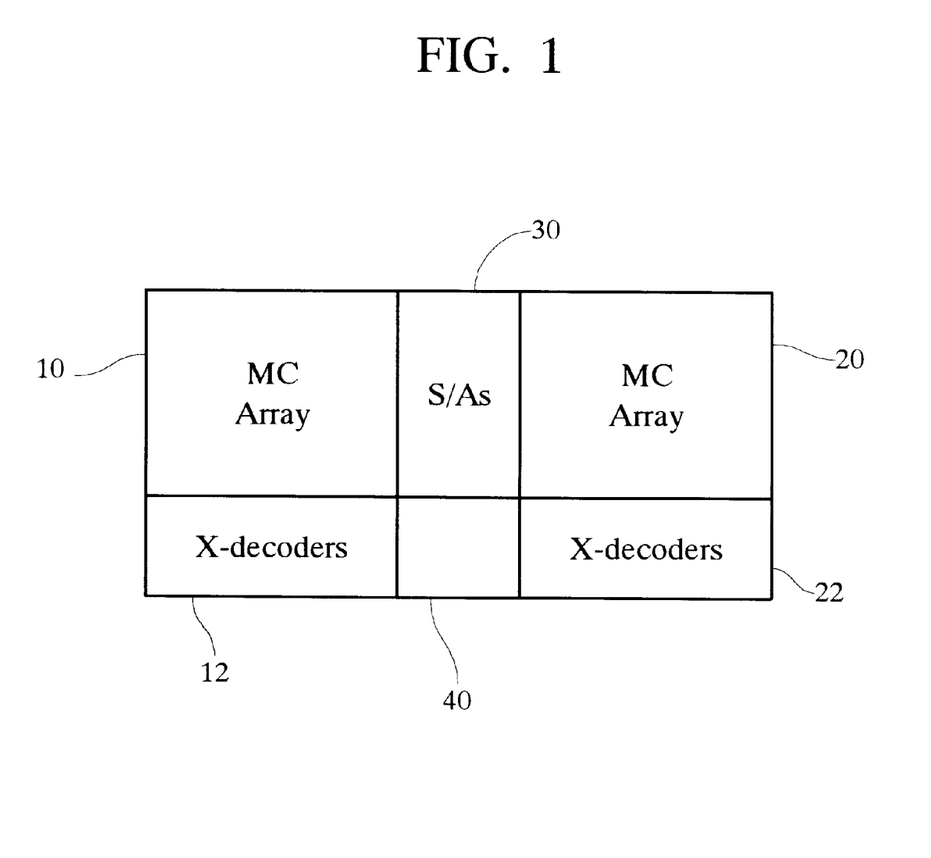
FIG. 1 is a layout diagram of part of a dynamic memory according to an embodiment.

FIG. 1 is a partial layout diagram of a dynamic memory according to an embodiment of the present invention. In this example layout, two memory cell arrays 10, 20 are arranged on both sides i.e. left and right of sense amplifier array 30. Memory cell arrays 10, 20 are each provided with adjacent X decoder drivers 12, 22 that select and drive word lines thereof, not shown. The read data amplified by the sense amplifier is output to the outside through an output circuit, not shown.

In this constructional example, a sense amplifier array 30 is arranged between the two memory cell arrays 10 and 20, its sense amplifiers being shared by the two memory cell arrays 10, 20. Bit line transfer gates for connecting bit line pairs, not shown, are therefore arranged between sense amplifiers and bit line pairs, a bit line transfer gate drive circuit 40 being provided that drives these bit line transfer gates.

Typically, a plurality of memory blocks as shown in FIG. 1 are provided to constitute a memory bank, a plurality of such memory banks being arranged to constitute a large-capacity semiconductor memory device.

Figure 2:
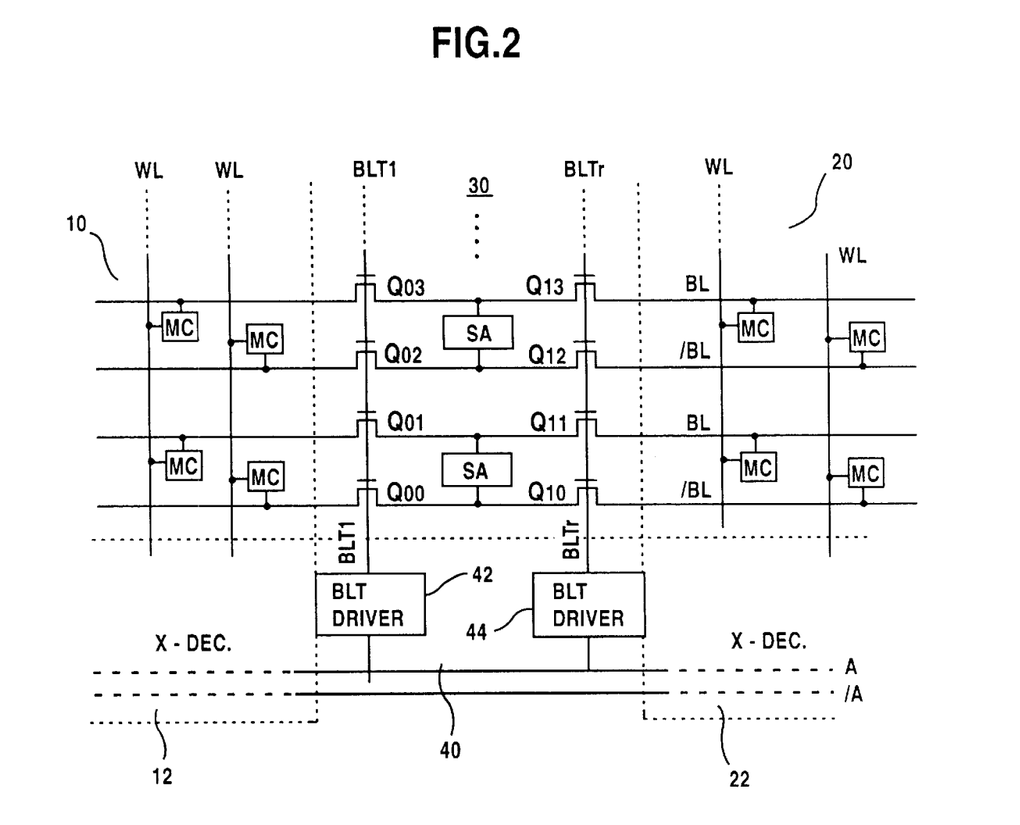
FIG. 2 is a circuit diagram of part of FIG. 1 shown to a larger scale.

FIG. 2 is a circuit diagram to a larger scale of part of FIG. 1. Within each memory cell array 10, 20 there are arranged respectively a plurality of word lines WL and a plurality of bit line pairs BL, /BL intersecting these (here and hereinbelow, /BL means BL bar); the memory cells MC are arranged at the intersections of these. Sense amplifiers SA are arranged between respective bit line pairs BL, /BL. Between sense amplifiers SA and the bit line pairs, there are respectively provided bit line transfer gates $Q_{00}$, $Q_{01}$, $Q_{02}$, $Q_{03}$, $Q_{10}$, $Q_{11}$, $Q_{12}$, and $Q_{13}$ for respective bit line pair selection. The gate electrodes of these bit line transfer gates $Q_{00}$~$Q_{03}$ and $Q_{10}$~$Q_{13}$ are driven by output BLTl and BLTr of bit line transfer gate drive circuits 42 and 44.

For example, when a memory cell MC in the right-hand memory cell array 20 is selected, output BLTl of bit line transfer gate drive circuit 42 becomes L level, bit line transfer gates $Q_{00}$~$Q_{03}$ become non-conductive, and the bit line pairs of the left-hand memory cell array 10 are isolated from the sense amplifiers SA. Also, the output BLTr of bit line transfer gate drive circuit 44 becomes a floating condition with H level, and bit line transfer gates $Q_{10}$~$Q_{13}$ maintain a conductive condition, so that the bit line pairs of the right-hand memory cell array 20 are connected to sense amplifiers SA. As a result, the minute potential differences of the bit line pairs in the right-hand memory cell array 20 are detected and amplified by the respectively corresponding sense amplifier SA. In the Figure, selection signals A, /A are signals for selecting the left and right memory cell arrays: for example, selection signal A selects the right-hand memory cell array 20, while selection signal /A selects the left-hand memory cell array 10. X decoder drivers 12, 22 select and drive one from the plurality of word lines in the respective memory cell arrays.

Figure 3:
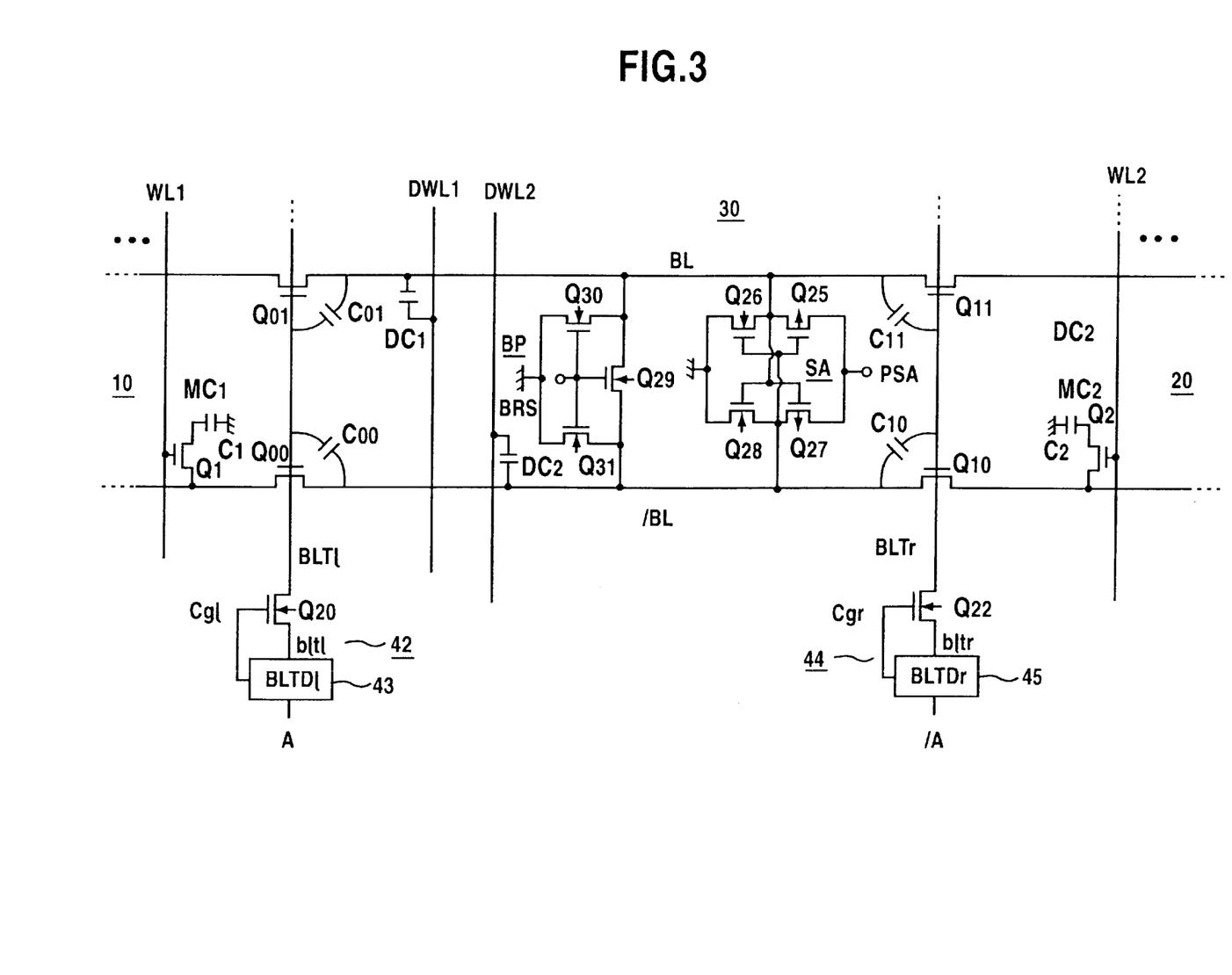
FIG. 3 is a detail view showing the relationship between a bit line pair and a sense amplifier.

FIG. 3 is a circuit diagram showing the relationship between the bit line pairs and sense amplifiers in more detail. Respective word lines WL1, WL2 are provided in left and right memory cell arrays 10, 20. A plurality of word lines are provided, though these are not shown. Memory cells MC1, MC2 are provided at the intersections of word lines WL1, WL2 with bit lines /BL. Each memory cell is constituted by a single transistor $Q_1$, $Q_2$ and a single capacitance C1, C2, respectively. Also, dummy word lines DWL1 and DWL2 are arranged on the inside of bit line transfer gates $Q_{00}$, $Q_{01}$, $Q_{10}$, $Q_{11}$ where sense amplifiers SA are arranged. Dummy cells DC1, DC2 are respectively provided at the intersections of dummy word lines WL1, WL2 and bit lines BL, /BL. In the example of FIG. 3, dummy cells DC1, DC2 comprise respective prescribed coupling capacitances. Dummy cells DC1, DC2 are shared by the left and right memory cell arrays 10, 20.

In the sense amplifier array 30 between the left and right memory cell arrays 10 and 20, there is provided sense amplifier SA consisting of a CMOS latching circuit, and a bit line pre-charging circuit BP that pre-charges the bit line pairs to ground potential Vss.

Sense amplifier SA is constituted by cross connection of a CMOS inverter consisting of a P-type MOS transistor $Q_{25}$ and N-type MOS transistor $Q_{26}$ and a CMOS inverter consisting of a P-type MOS transistor $Q_{27}$ and N-type MOS transistor $Q_{28}$. The common source of N-type MOS transistors $Q_{26}$, $Q_{28}$ is connected to ground potential and the common source of P-type MOS transistors $Q_{25}$ and $Q_{27}$ is supplied with a sense amplifier activation signal PSA.

Bit line pre-charging circuit BP comprises transistor $Q_{29}$ that short-circuit the bit line pair and earthing transistors $Q_{30}$, $Q_{31}$ that make the bit line pair ground potential Vss. These transistors conduct under the control of bit line reset signal BRS.

In the example of FIG. 3, the gate electrodes of bit line transfer gates $Q_{00}$, $Q_{01}$, $Q_{10}$, $Q_{11}$ of the N-type MOS transistors are driven by respective drive signals BLTl and BLTr. This drive signal BLTl is generated by a bit line transfer gate drive circuit 42 consisting of a drive circuit 43 and N-type MOS transistor $Q_{20}$. Transistor $Q_{20}$ is a cut-off transistor for putting drive signal BLTl in floating condition, and is controlled by a floating control signal cgl. On the other hand, control signal BLTr is generated by bit line transfer gate drive circuit 44, which consists of drive circuit 45 and N-type MOS transistor $Q_{22}$. Transistor $Q_{22}$ is a cut-off transistor for putting drive signal BLTr in floating condition, and is controlled by floating control signal cgr.

Respective drive circuits 43, 45 are supplied with respective memory cell array selection signals A, /A; when active, they maintain the outputs bltl and bltr on the non-selected side at L level and the outputs bltl and bltr on the selected side at H level (power source voltage Vcc level). Also, when active, before the rise of the activation signal PSA of the sense amplifier SA, of the floating control signals cgl or cgr, the control signal which is associated with the selected cell array is lowered from the boosted voltage Vpp to the power source voltage Vcc, so that the corresponding transistors $Q_{20}$ and $Q_{22}$ are made non-conductive. As a result, the signal line of the drive signal BLTl, BLTr on the selected side is put into floating condition.

In the example of FIG. 3, the signal lines of drive signals BLTl and BLTr are connected to the gate electrodes of bit line transfer gates $Q_{00}$, $Q_{01}$, $Q_{10}$, $Q_{11}$, and coupling capacitances $C_{00}$, $C_{01}$, $C_{10}$, $C_{11}$ are arranged between the bit line pairs BL, /BL of their gate electrode and sense amplifier. For these coupling capacitances, the stray capacitances between the gate and drain or gate and source of bit line transfer gates $Q_{00}$, $Q_{01}$, $Q_{10}$, $Q_{11}$ may be utilised, or coupling capacitances may be specially formed between them. It is desirable that the coupling capacitances should be as large as possible in order to raise the boosting efficiency (voltage boosting efficiency) of control signals BLTl, BLTr when rewriting.

If the coupling capacitance is typically Cg, and the capacitance of control signal lines BLTl, BLTr per sense amplifier is $C_L$, the boost efficiency η ($V_{boost}$/V in) is:

$$\eta = Cg/(2Cg+C_L)$$

It can therefore be understood that if the coupling capacitance Cg is made large, the boost efficiency is a maximum of 50%. This can be clearly understood from the explanation of the operation of the memory, given later.

Figure 4:
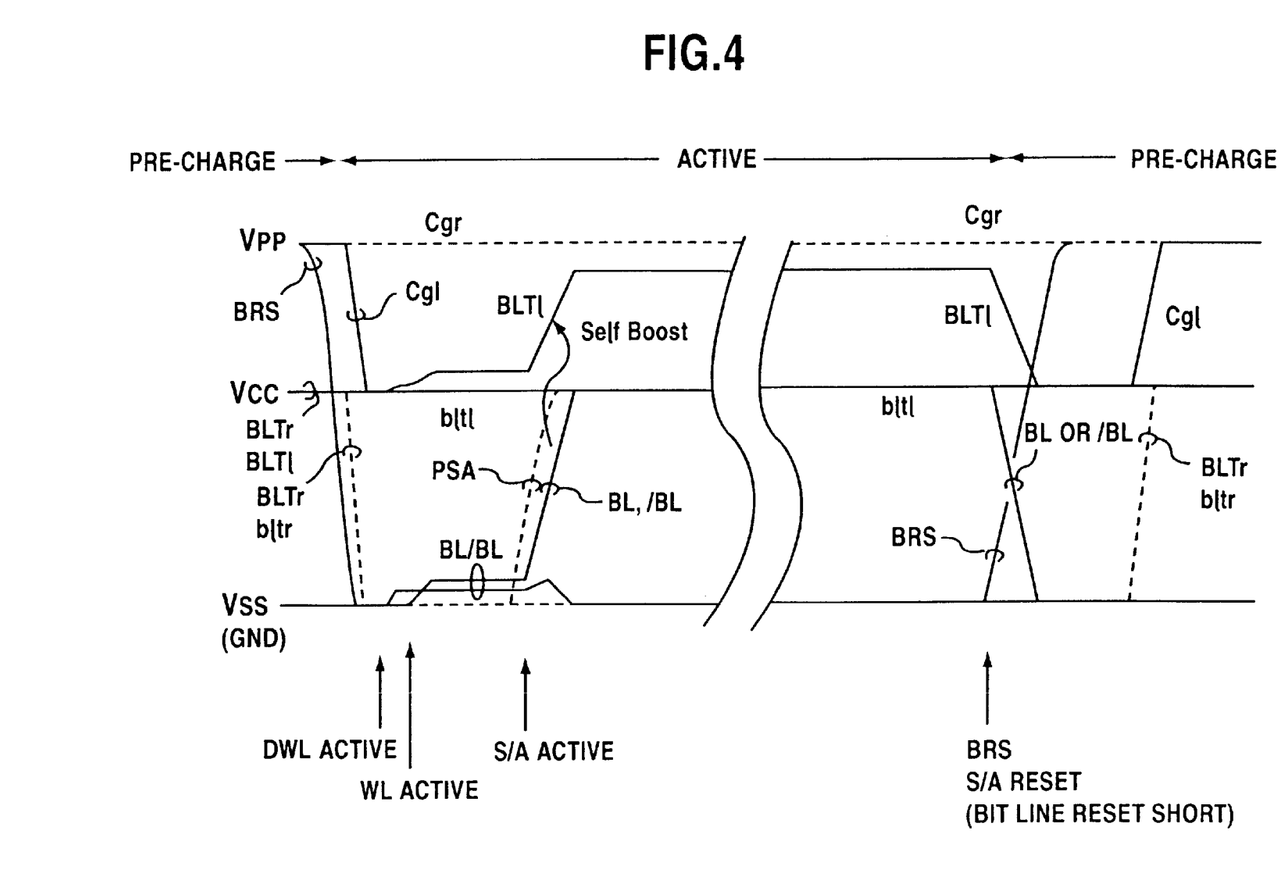
FIG. 4 is a signal waveform diagram given in explanation of the operation of the memory circuit of FIG. 3.

FIG. 4 is a signal waveform diagram given in explanation of the operation of the memory circuit of FIG. 3. FIG. 4 shows the pre-charging period, active period and re-precharging period. At the time when the active period is completed, all the transistors of the pre-charging circuit BP are put into conductive condition by generation of bit line reset signal BRS, causing bit line pairs BL, /BL to be short-circuited and pre-charged to ground potential Vss. Also, the outputs bltl and bltr of drive circuits 43 and 45 are brought to the level of the power source voltage Vcc (for example 3V), and the control signals cgl and cgr are both brought to boosted power source Vpp (for example 5V). As a result, drive signal bltl and bltr are both brought to power source voltage Vcc level.

When the active period is commenced, in response to selection signal A, /A of memory cell array 10, 20, one or other of output bltl or bltr of drive circuits 43, 45 is lowered to ground potential Vss. The example of FIG. 4 is one in which memory cell array 10 is selected, so the output bltr of drive circuit 45 is lowered to level L. As a result, drive signal BLTr is also likewise lowered to level L.

On the other hand, control signal cgr is maintained at boosted power source Vpp, but the control signal cgl of the selected side is lowered from boosted power source Vpp to power source voltage Vcc. As a result, the voltage between the gate and source of transistor Q20 becomes less than the threshold voltage Vth so that it becomes non-conducting, and the signal line of drive signal BLTl becomes a floating condition.

Word lines WL of the left-hand memory cell array 10 and corresponding dummy word line DWL are thereupon raised in potential. The level to which these word lines are raised is normally higher than power source voltage Vcc and is for example the boosted power source level Vpp. In the present embodiment, the pre-charging level of the bit line pairs is ground potential Vss. Thereupon, in response to the rise of the dummy word line DWL1, the potential of the bit lines BL on the reference side is raised by coupling, by means of the coupling capacitance DCl, from ground potential to the prescribed voltage Vref. And, in response to the rise of the word line WL, the selected transistor $Q_1$ of memory cell MC1 conducts, so that, depending on whether charge is stored in cell capacitance C1 or not, the potential of bit line /BL is either boosted to the prescribed voltage higher than Vref from ground potential, or left at ground potential.

This bit line /BL boosted voltage is a voltage obtained by the voltage Vcell in cell capacitance C1 and a ratio C1/($C_B$+ C1) which is the capacitance ratio of the bit line /BL capacitance CB and cell capacitance C1. The dummy cell capacitance, the cell capacitance and the bit line capacitance are designed such that the boosted voltage of the bit line when charge has been accumulated in cell capacitance C1 is about twice the boosted voltage Vref of the bit line produced by the dummy word line mentioned above.

In this way, the minute potential difference generated on the bit line pair is detected by activating the sense amplifier SA and amplified. Specifically, in response to boosting of the activation signal PSA of the sense amplifier SA, the potential difference of the bit line pairs is detected by the difference amplifier comprising P-type transistors $Q_{25}$ and $Q_{27}$, and the nodes of the H-side bit line are amplified and driven to power source voltage Vcc level by P-type transistor $Q_{25}$ or $Q_{27}$.

As mentioned above, prior to activation of this sense amplifier, drive signal line BLTl is in floating condition. Consequently, in response to the boosting of bit line BL or /BL to power source voltage Vcc, the signal line of drive signal BLTl is boosted by the self-boosting action produced by coupling capacitance C00 or C01.

As described above, the boosting efficiency η ($V_{boost}$/V in) is $$\eta = Cg/(2Cg+C_L).$$

Taking this as being 50% at maximum, assuming the power source voltage Vcc is 3 V and the voltage of the drive signal BLTl before boosting is also 3 V, i.e. the level of power source voltage Vcc, drive signal BLTl is boosted by the self-boosting described above to 4.5 V. Consequently, if the threshold voltage of the bit line transfer gate $Q_{00}$ or $Q_{01}$ is less than 1.5 V, the rewrite level of the memory cell is 3 V, i.e. the level of power source voltage Vcc.

When in due course the active period ends, in response to the rise of the bit line reset signal BRS, bit line pairs BL, /BL are pre-charged to ground potential Vss.

As described above, in the bit line transfer gate drive circuits 42 and 44, the drive signal BLTl or BLTr signal line can be self-boosted in voltage up to the boosted power source Vpp, without applying the boosted power source Vpp to drive signal BLTl or BLTr. Power consumption can thereby be greatly reduced.

In the present embodiment, the pre-charging level of the bit lines is made a potential considerably lower than power source voltage Vcc, and drive of the bit lines from this potential up to power source voltage Vcc level is utilised in order to achieve self-boosting of drive signals BLTl or BLTr. In general, the system wherein, as conventionally, pre-charging is effected to a level of ½ of the power source voltage Vcc becomes to be difficult to adopt on account of the trend towards lowering the voltage of the power source voltage Vcc. More specifically, a bit line potential in the vicinity of ½ of the level of the power source voltage Vcc, which has been reduced in voltage (for example to 2 V), approaches the threshold voltage of the transistors constituting the differential amplifier in the sense amplifier so that it is impossible to get these transistors to conduct. Accordingly, it is preferable to have a system in which a differential amplifier function of P-type transistors within the sense amplifier circuit is utilised, making the pre-charging level of the bit lines quite low, for example ground potential Vss. Furthermore, since, during the pre-charging period, the bit line pairs can all be lowered to ground potential, there is no question of power consumption for purposes of achieving pre-charging. However, in this case, it is necessary to generate a reference potential on the bit line on the opposite side by providing dummy cells.

Also, the potential on the H-level side of the bit line need not necessarily be power source voltage Vcc level. Thus, it may be set to an optimum high voltage taking into account memory cell capacitance and bit line capacitance etc. In this case, the H-level potential driven by the sense amplifier is matched to the H-level potential of the bit line. Thus, by putting the gate electrode of the bit line transfer gate in floating condition, operation identical with that described above can be achieved.

Figure 5:
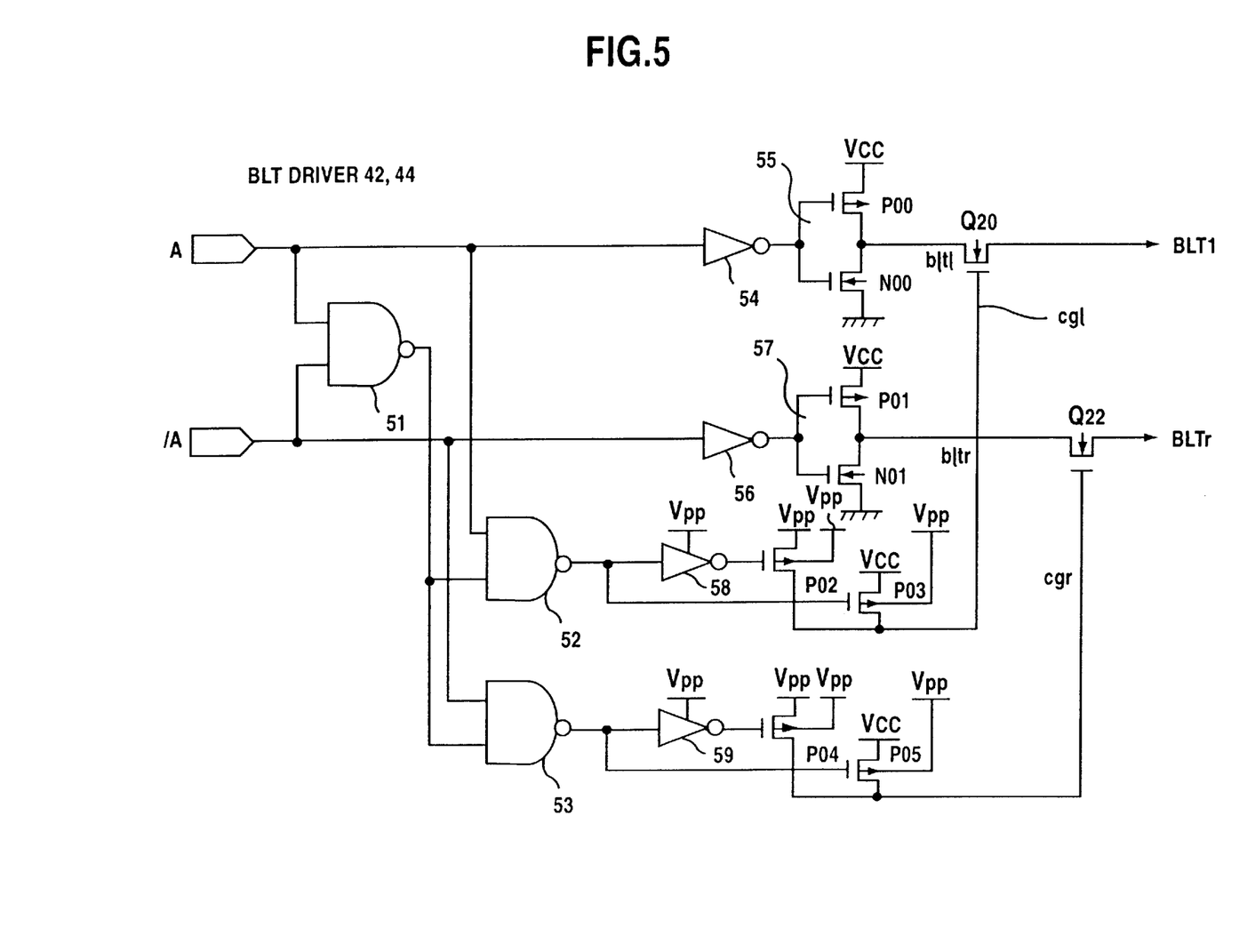
FIG. 5 is a circuit diagram illustrating a specific example of a bit line transfer gate drive circuit.

FIG. 5 is a circuit diagram showing a specific example of bit line transfer gate drive circuits 42 and 44. These bit line transfer gate drive circuits 42 and 44 comprise drive circuits 43 and 45 and cut-off transistors $Q_{20}$, $Q_{22}$ shown in FIG. 3.

In this circuit example, outputs bltl or bltr are generated by inverter 54 or 55 and inverter 56 or 57 in accordance with the memory cell array selections signal A or /A. Their output, at H level, is the level of power source voltage Vcc. In contrast, control signals cgl, cgr are generated by control signal generating circuits comprising NAND gates 51, 52, 53, inverters 58, 59 with a level-converting function, and P-type transistors P02, P04 connected to boost voltage Vpp and P-type transistors P09, P05 connected to power source Vcc.

In this circuit, unless otherwise specially shown, the back gates of the P-type transistors are supplied with power source voltage vcc and the back gates of the N-type transistors are supplied with ground potential Vss.

Figure 6:
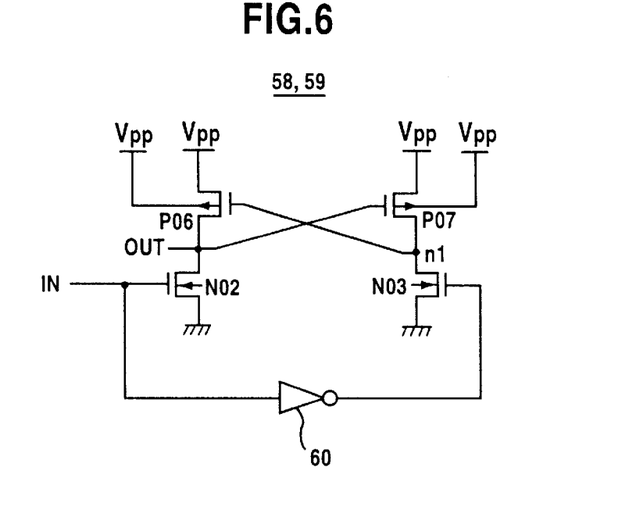
FIG. 6 is a detailed circuit diagram of inverters 58, 59 equipped with a level conversion function.

FIG. 6 is a detailed circuit view of inverters 58, 59 equipped with a level conversion function. The inverting output with H level of the boosted power source Vpp is generated for an input in with H level of the power source voltage Vcc. When input in is H level, N-type transistor N02 is ON and N-type transistor N03 is OFF. As a result, node n1 is raised to the boosted power source Vpp level by P-type transistor P07, the non-conduction of P-type transistor P06 is compensated, and its output out becomes ground-potential L level. Also, if input in is L level, transistor N02 is turned OFF, transistor N03 is turned ON, and the boosted power source Vpp level i.e. H level is output at output out.

Returning to FIG. 5, the operation will be described. First of all, in the pre-charging period, the memory cell array selection signals A, /A are both H level. Consequently, outputs bltl and bltr are both power source voltage Vcc level. Also, the output of NAND 51 is L level and the outputs of NANDs 52 and 53 are both H level. As a result, the outputs of inverters 58, 59 become L level, transistors P02 and P04 conduct, and control signals cgl and cgr are both the boosted power source Vpp level. Consequently, drive signals BLTl and BLTr are both power source voltage Vcc level.

Next, when the active period is reached, one or other of selection signals A, /A becomes L level. If we now provisionally assume that the left-hand cell array in FIG. 3 is selected, selection signal Astays H level, whereas selection signal /A becomes L level. As a result, the output of NAND gate 51 becomes H level, the output of NAND gate 52 becomes L level, and the output of NAND gate 53 becomes H level. Consequently, the output of converter 58 becomes boosted power source Vpp level and transistor P02 is rendered non-conducting; transistor P03 is rendered conducting and control signal cgl is lowered to power source voltage Vcc level. In contrast, the output of inverter 59 stays L level, and control signal cgr stays at boosted power source Vpp level.

Due to the drop of control signal cgl to power source voltage Vcc level, the signal line of drive signal BLTl becomes floating. In contrast, due to the maintaining of control signal cgr at boosted power source Vpp, drive signal BLTr side drops to ground potential Vss in response to fall of output bltr to L level.

Thus, as above, in the active period, depending on the memory cell array selection signals A, /A, the bit line transfer gate drive circuit shown in FIG. 5 puts the drive signal line BLTl on the selected side into floating condition, and makes the drive signal line BLTr on the non-selected side L level. During the pre-charging period, both the drive signals BLTl and BLTr become power source voltage Vcc level.

It may be remarked that control signals cgl, cgr are boosted to boosted power source Vpp, but, since these control signals only drive the gate electrodes of cut-off transistors $Q_{20}$ and $Q_{22}$, their power consumption is not particularly great.

Figure 7:
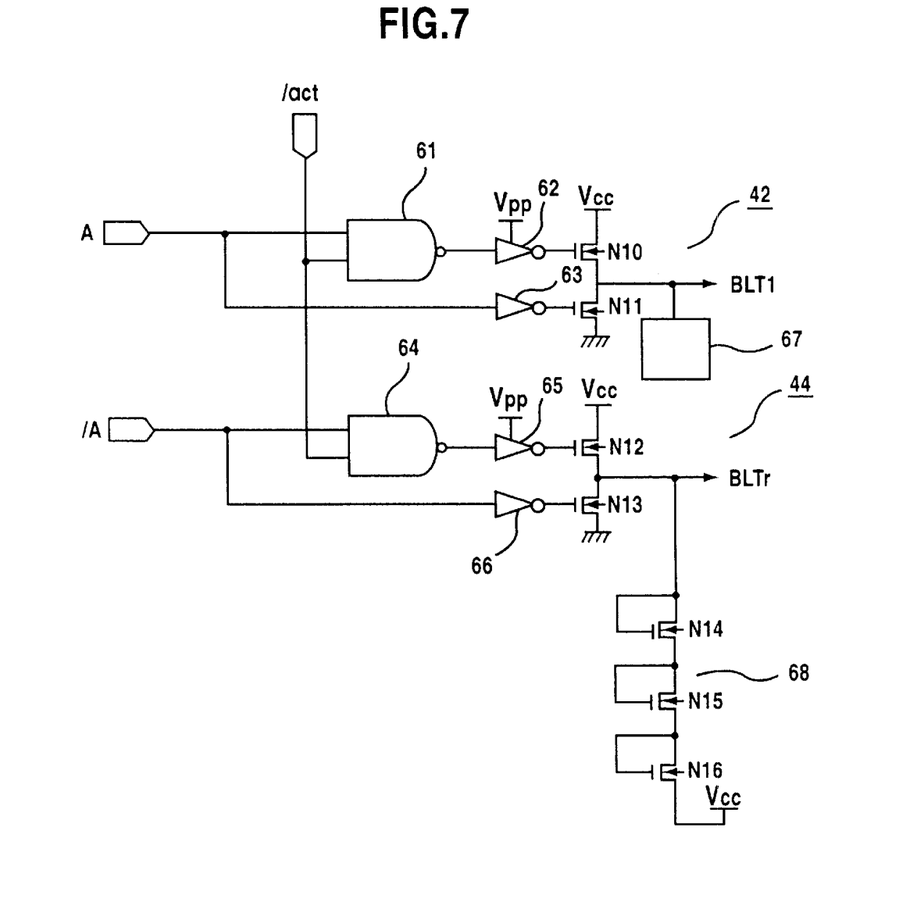
FIG. 7 is a circuit diagram illustrating another specific example of a bit line transfer gate drive circuit.

FIG. 7 is a circuit diagram showing a further example of a bit line transfer gate drive circuit. This example is simplified in comparison with the circuit of FIG. 5 and control signals cgl, cgr are not required. Also, cut-off transistors as in FIG. 3 are not required. The output stage of the drive circuit has an N-type transistor push-pull construction, and clamping circuits 67, 68 are provided for output drive signal lines BLTl, BLTr.

This bit line transfer gate drive circuit employs a control signal /act. This control signal /act is H level during the pre-charging period and L level during the active period. Memory cell array selection signal A, /A are supplied to respective bit line transfer gate drive circuits 42, 44. In this example, the outputs of the respective drive circuits comprise N-type transistors N10, N11 and N12, N13 and are respectively driven by respective inverters 62, 65 having a level conversion function and ordinary inverters 63, 66. 61, 64 are NAND gates that input control signal /act and selection signals A, /A. Also, to output control signal terminals BLTl, BLTr, there are connected clamping circuits 67, 68 that effect clamping at a level raised from the power source voltage Vcc by the threshold value of three transistor diode stages N14, N15 and N16.

The operation of this drive circuit will now be described. In the pre-charging period, control signal /act is H level and both selection signals A, /A are H level, so the outputs of NAND gates 61, 64 are both L level and inverters 62, 65 are the level of boosted power source Vpp. As a result, transistors N10 and N12 conduct and both control signals BLTl and BLTr are power source voltage Vcc level.

Next, in the active period, control signal /act becomes L level and one or other of selection signals A, /A becomes L level. If in accordance with this example we assume that selection signal/A has become L level, the output of NAND gate 64 becomes H level and the output of inverter 65 becomes L level. Also, since the output of inverter 66 becomes H level, transistor N13 conducts and control signal BLTr drops to L level (ground level). As a result, the corresponding bit line transfer gate becomes non-conductive and the bit line pair is isolated from the sense amplifier. In contrast, the output of NAND gate 61 becomes H level and the output of inverter 62 becomes L level, so transistor N10 becomes non-conductive. Also, the output of inverter 63 becomes L level and transistor Nil also becomes non-conductive. As a result, the signal line of control signal BLTl becomes floating.

When the signal line of control signal BLTl becomes floating, the gate electrode of the bit line transfer gate is boosted in voltage higher than power source voltage Vcc by capacitative coupling accompanying the boosting of the bit line. Thus, rewriting to the memory cells on the H-level side is performed at power source voltage Vcc level.

It should be noted that, since the rewriting operation is continuously performed, if this boosting action is repeated with control signal terminals BLTr, BLTl remaining in floating condition, there is a possibility that excess voltage may be applied to control signal terminals BLTr, BLTl, with the consequent risk of breakdown of the gate insulating film of the bit line transfer gates. Therefore, in this example, clamping circuits 67, 68 referred to above are provided, in order to prevent their becoming higher than the power source voltage Vcc by more than three times the threshold voltage of the transistors.

Figure 8:
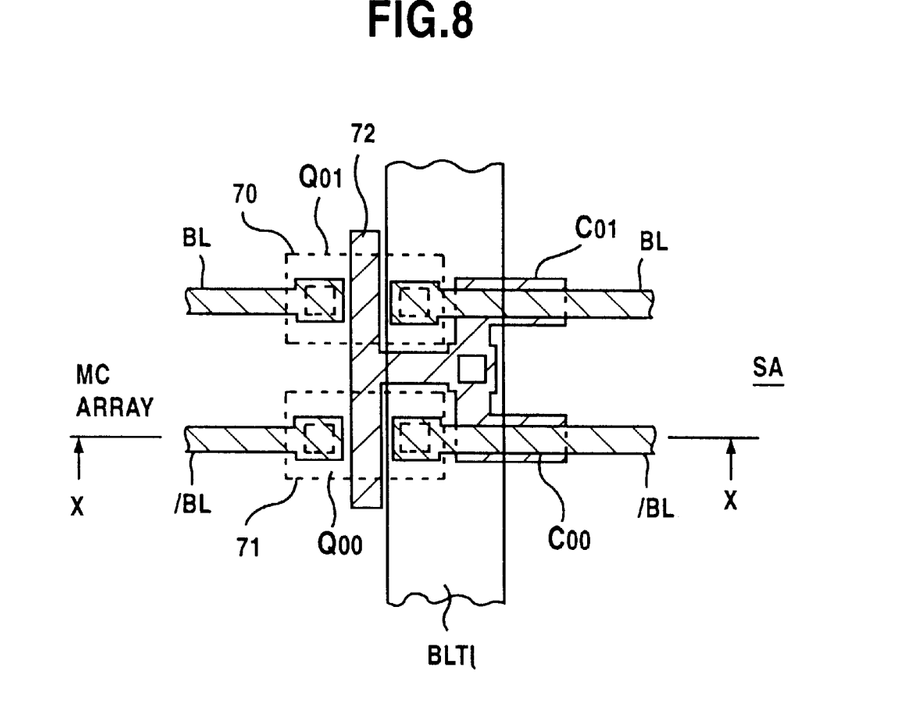
FIG. 8 is a layout diagram showing a specific layout example of bit line transfer gates $Q_{00}$ and $Q_{01}$, and coupling capacitances $C_{00}$, $C_{01}$.
Figure 9:
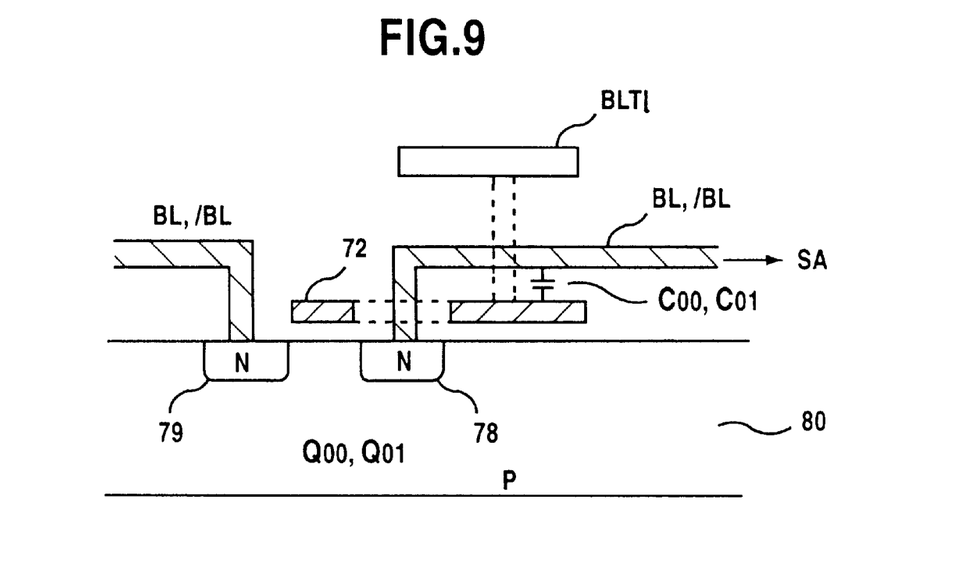
FIG. 9 is a diagrammatic cross-sectional view of the portion XX of FIG. 8.

FIG. 8 is a layout diagram showing a specific example layout of bit line transfer gates $Q_{00}$, $Q_{01}$ and coupling capacitances $C_{00}$, $C_{01}$. FIG. 9 is a cross-sectional view of the portion XX of FIG. 8. In this constructional example, 70 and 71 are transistor regions and the bit line transfer gates $Q_{01}$, $Q_{01}$ are formed in these respective regions. 72 is formed by a first polysilicon layer and bit lines BL, /BL are formed by a second polysilicon layer. Sense amplifiers SA are arranged on the right-hand side in FIG. 8, and the memory cell array is arranged on the left-hand side. The wiring for the control signal BLTl of the bit line transfer gate is constituted by for example a metallic layer provided as an upper layer; this is connected to first polysilicon layer 72 as shown in FIG. 9. In this example, coupling capacitances $C_{00}$ and $C_{01}$ are formed between first polysilicon layer 72 and the second polysilicon layer, which is the bit lines BL, /BL formed on the sense amplifier side.

Figure 10:
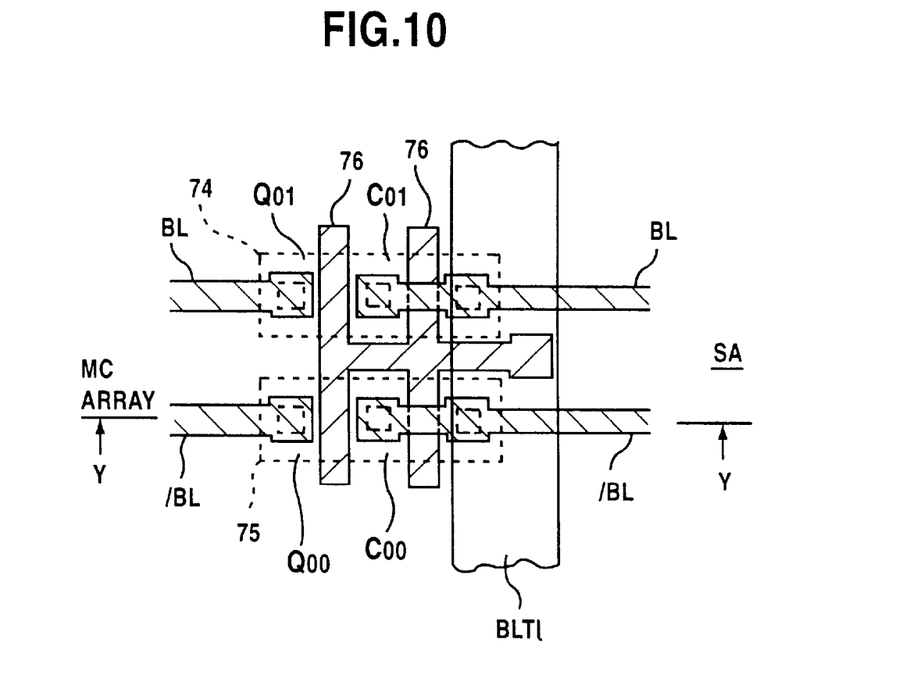
FIG. 10 is a layout diagram showing a further specific layout example of bit line transfer gates $Q_{00}$ and $Q_{01}$, and coupling capacitances $C_{00}$, $C_{01}$.
Figure 11:
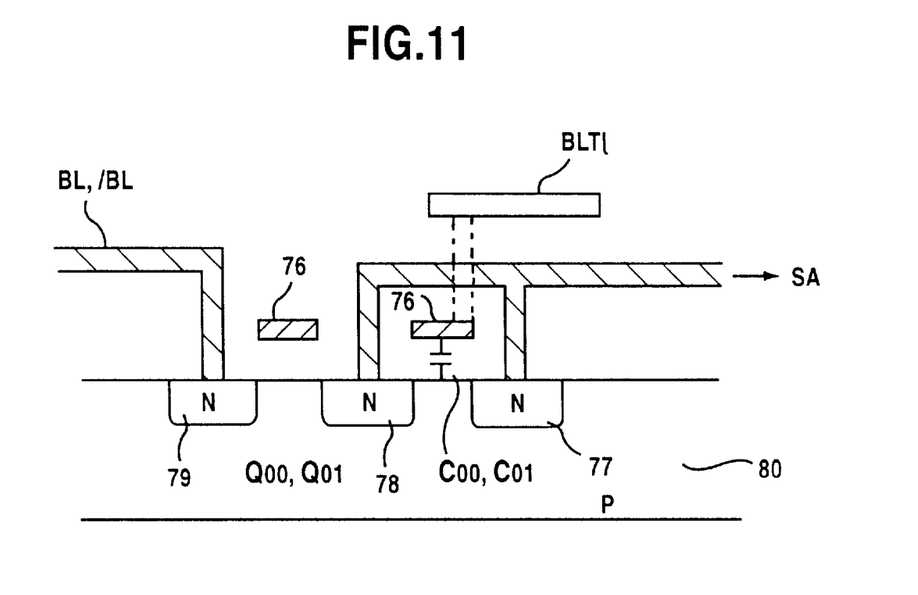
FIG. 11 is a diagrammatic cross-sectional view of the portion YY of FIG. 10.

FIG. 10 is a layout diagram showing another specific layout example of bit line transfer gates $Q_{00}$, $Q_{01}$ and coupling capacitances $C_{00}$, $C_{01}$. FIG. 11 is a cross-sectional view of the portion YY of FIG. 10. In this layout example, bit line transfer gates $Q_{00}$ and $Q_{01}$ are formed in transistor regions 74, 75, and coupling capacitances $C_{00}$, $C_{01}$ are also formed. The coupling capacitances are formed between first polysilicon layer 76 and N-type regions 77, 78 formed in substrate 80, and channel regions therebetween. Other aspects are the same as in the examples of FIGS. 8 and 9.

As described above, the coupling capacitances are formed between the bit lines on the sense amplifier side and the gate electrodes of the bit line transfer gates. As a result, in response to the boosting of one of the bit lines of the bit line pair connected by activation of sense amplifier SA, the gate electrode of the bit line transfer gate is boosted in voltage by coupling with capacitances $C_{00}$, $C_{01}$, so that one or other of the bit line pair of the memory cell side is boosted to power source voltage Vcc level.

Figure 12:
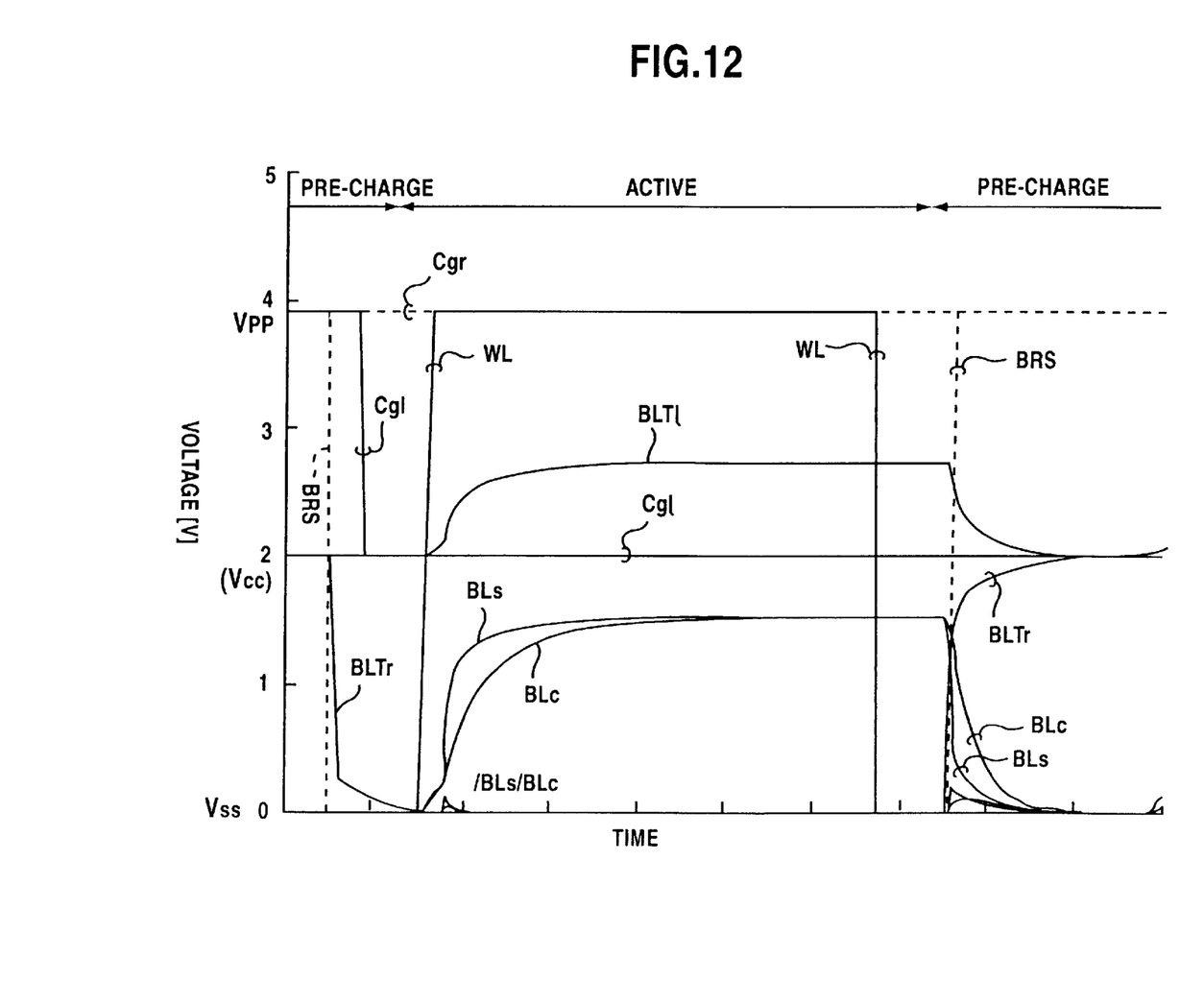
FIG. 12 is a waveform diagram showing the results of operation simulation when the bit line transfer gate drive circuit of the embodiment shown in FIG. 5 is employed.

FIG. 12 is a waveform diagram showing the results of simulation of operation when the bit line transfer gate drive circuit shown in FIG. 5 according to the present embodiment is employed. In this example, a power source voltage Vcc of 2 V, and a boosted power source Vpp of about 4 V are adopted. For the memory cell arrays 10 and 20 and sense amplifier array 30 shown in FIG. 1, 1.5 V is used as power source and for the peripheral circuitry such as decoders 12 and 22, 2.0 V is used as power source; thus the speed of the peripheral circuitry is raised and reduction in power of the memory cell array portions occupying most of the memory is achieved. 2.0 V is employed for the stand-by voltage of the control signal BLT of the bit line transfer gate. It should be noted that the bit line on the sense amplifier side of bit lines BL, /BL is denoted by BLs and the bit line on the memory cell array side is denoted by BLc.

As shown in FIG. 12, the bit line transfer gate control signal BLTl is boosted on activation of the sense amplifier in the active period and boosting of the bit line BLs connected thereto. Concurrently, the bit line BLc on the memory cell array side is also boosted to power source voltage Vcc. It has been found that normal operation can be achieved even though the power source voltage Vcc is 2.0 V.

In the above embodiment, the pre-charging level of the bit lines was taken as being ground potential Vs, but, if they are pre-charged to a potential less than half the voltage of the H side of the bit lines, on activation of the sense amplifiers, the gate electrodes of the bit line transfer gates are boosted by the coupling action, so the same action and benefits can be obtained.

Also, it is not necessarily essential for the H level of the bit lines to be power source voltage Vcc level as shown in the embodiment of FIG. 12. With regard to the high second potential, the pre-charging potential can be a first potential less than half the second potential. In this case, the bit line on the sense amplifier side connected to the output terminal of the sense amplifier is driven to the second potential by the amplification action of the sense amplifier and, in response to this, the gate electrode of the bit line transfer gate is boosted by a self-boosting action, so that the potential of the bit line on the memory cell side is also driven to this second potential.

As described above, with the present invention, in a bit line transfer gate drive circuit that drives the gate electrodes of bit line transfer gates, the gate electrodes can be boosted in response to activation of the sense amplifiers without performing drive action for the gate electrodes utilising a boost power source: thus a satisfactory rewriting action can be achieved while decreasing power consumption. Consequently, a semiconductor memory device can be provided that can meet demands for lowering of power source voltage, lowered power consumption and increased capacity.

What is claimed is:

1. A semiconductor memory device comprising:
   first and second memory cell arrays comprising a plurality of word lines, a plurality of bit line pairs intersecting thereto, and memory cells provided at intersections therebetween;
   a pre-charging circuit that drives the bit line pairs together to a first potential in a pre-charging period;

a row of sense amplifiers, arranged between the first and second memory cell arrays, in an active period, detecting potential differences between said bit line pairs and driving ones of said bit line pairs to a second potential higher than the first potential;

first bit line transfer gates respectively arranged between the bit line pairs in the first memory cell array and the sense amplifiers, conducting when the first memory cell array is selected;

second bit line transfer gates respectively arranged between the bit line pairs in the second memory cell array and the sense amplifiers, conducting when second memory cell array is selected; and a bit line transfer gate drive circuit which puts the gate electrodes of the first or second bit line transfer gates into floating condition in the active period, in response to a selection of the first or second memory cell array.

2. The semiconductor memory device according to claim 1 wherein the first potential is a potential lower than half a power source voltage.

3. The semiconductor memory device according to claim 2 wherein the second potential is a potential about the same as the power source voltage.

4. The semiconductor memory device according to claim 1 wherein the bit line transfer gate drive circuit makes the first and second bit line transfer gates conductive in the pre-charging period, and in the active period, the bit line transfer gate drive circuit makes one of the first and second bit line transfer gates non-conductive, and puts the gate electrodes of the other of the first and second bit line transfer gates into the floating condition.

5. The semiconductor memory device according to claim 1 wherein predetermined coupling capacitances are provided between the gate electrodes of the first and second bit line transfer gates and the corresponding bit line pairs; and in the active period, on amplifying the potential differences between said bit line, through the coupling capacitances, potential at the gate electrodes that are in the floating condition are boosted into a power source voltage or more.

6. A semiconductor memory device comprising:

first and second memory cell arrays comprising a plurality of word lines, a plurality of bit line pairs intersecting thereto, and memory cells provided at intersections therebetween;

a pre-charging circuit that drives the bit line pairs together to a first potential in a pre-charging period;

a row of sense amplifiers, arranged between the first and second memory cell arrays, in an active period, detecting potential differences between said bit line pairs and driving ones of said bit line pairs to a second potential higher than the first potential;

first bit line transfer gates respectively arranged between the bit line pairs in the first memory cell array and the sense amplifiers, conducting when the first memory cell array is selected;

second bit line transfer gates respectively arranged between the bit line pairs in the second memory cell array and the sense amplifiers, conducting when the second memory cell array is selected; and a bit line transfer gate drive circuit which makes the first and second bit line transfer gates conductive in the pre-charging period, and, in the active period, the bit line transfer gate drive circuit puts gate electrodes of ones of the first and second bit line transfer gates into floating condition, and makes the other of the first and second bit line transfer gates non-conductive.

7. A semiconductor memory device comprising:

bit line pair;

memory cells each connected to either of the bit line pair;

a pre-charging circuit that pre-charges the bit line pair together to a first potential in a pre-charging period;

a sense amplifier, operatively connected to said bit line pair, in an active period, detecting a potential difference of the bit line pair and driving one of said bit line pair to a second potential higher than the first potential;

a pair of bit line transfer gates each arranged between one of the bit line pair and the sense amplifier; and a bit line transfer gate drive circuit which puts gate electrodes of the pair of bit line transfer gates into floating condition in the active period wherein one of the memory cells is selected.

8. A method for operating a semiconductor memory device having memory cells connected to a bit line and a transfer gate transistor disposed between the bit line and a sense amplifier, comprising steps of:

pre-charging the bit line to a first potential;

setting a potential at a gate electrode of the transfer gate transistor to a second potential higher than the first potential, then putting the gate electrode into floating condition wherein one of one of the memory cells in selected; and activating the sense amplifier, thereby the potential at the gate electrode being self-boosted and becoming higher than the second potential.

* * * * *